United States Patent [19]

Calderbank

[11] Patent Number: 4,788,694
[45] Date of Patent: Nov. 29, 1988

[54] TRELLIS CODING WITH SUBSTRATES

[75] Inventor: Arthur R. Calderbank, Plainfield, N.J.

[73] Assignee: American Telephone and Telegraph Company, AT&T Bell Laboratories, Murray Hill, N.J.

[21] Appl. No.: 17,894

[22] Filed: Feb. 20, 1987

[51] Int. Cl.$^4$ ............................................. H04L 27/04
[52] U.S. Cl. ......................................... 375/59; 375/18
[58] Field of Search ................. 375/17, 18, 38, 39, 375/42, 58, 59, 67; 371/43, 50

[56] References Cited

U.S. PATENT DOCUMENTS

| | | | |
|---|---|---|---|
| 4,489,418 | 12/1984 | Mazo | 375/27 |
| 4,581,601 | 4/1986 | Calderbank et al. | 375/94 |
| 4,597,090 | 6/1986 | Forney, Jr. | 375/67 |
| 4,601,044 | 7/1986 | Kromer, III. et al. | 375/118 |
| 4,660,214 | 4/1987 | Pahlavan et al. | 375/58 |

Primary Examiner— Griffin
Assistant Examiner—Stephen Chin
Attorney, Agent, or Firm—Ronald D. Slusky

[57] ABSTRACT

A succession of (k+n)-bit input words are coded for transmission over a (1 - D) partial response channel by applying n of the bits of each word to a trellis coder which, in turn, selects one of a plurality of $2^m$ cosets from a predefined lattice, where M>n. A signal point, or "seed," is then selected as a function of both (a) the values of the other k bits and (b) the value, referred to as the "channel state", of the last pulse in the previous signalling interval, in such a way as to ensure that the signal point presented to the receiver is a point in the selected cost. Viterbi decoding on the cosets is then used in the receiver to recover the most likely sequence of transmitted signal points and, in turn, the (k+n)-bit input words.

14 Claims, 7 Drawing Sheets

TARGET COSET: (0, 1)

| CHANNEL STATE ($y_{i-1}$) NON-TRELLIS CODED BITS | 0 | 1 | $\overline{1}$ | 2 | RECEIVED SIGNAL POINT ($x'_i, y'_i$) |
|---|---|---|---|---|---|
| 00 | (0,1) | (1,2) | ($\overline{1}$,0) | (0,$\overline{1}$) | (0,1), ($\overline{2}$,$\overline{1}$) |
| 01 | (2,1) | (3,2) | (1,0) | (2,$\overline{1}$) | (2,$\overline{1}$), (0,$\overline{3}$) |
| 10 | ($\overline{2}$,1) | ($\overline{1}$,2) | ($\overline{3}$,0) | ($\overline{2}$,$\overline{1}$) | ($\overline{2}$,3), ($\overline{4}$,1) |
| 11 | (4,1) | ($\overline{3}$,2) | (3,0) | (4,$\overline{1}$) | (4,$\overline{3}$), ($\overline{4}$,5), (2,5) |

ENCODER DECISION RULE

SEEDS ($x_i, y_i$)

FIG. 12

TARGET COSET: (0, 3)

| CHANNEL STATE ($y_{i-1}$) NON-TRELLIS CODED BITS | 0 | 1 | $\overline{1}$ | 2 | RECEIVED SIGNAL POINT ($x'_i, y'_i$) |
|---|---|---|---|---|---|
| 00 | (0,$\overline{1}$) | (1,0) | (1,2) | (2,1) | (0,$\overline{1}$), (2,1) |
| 01 | (2,$\overline{1}$) | (3,0) | ($\overline{1}$,2) | (4,1) | (2,$\overline{3}$), (0,3) |
| 10 | ($\overline{2}$,$\overline{1}$) | ($\overline{1}$,0) | (3,2) | (0,1) | ($\overline{2}$,1), (4,$\overline{1}$) |
| 11 | (4,$\overline{1}$) | ($\overline{3}$,0) | ($\overline{3}$,2) | ($\overline{2}$,1) | (4,5), ($\overline{4}$,3), (2,5) |

ENCODER DECISION RULE

SEEDS ($x_i, y_i$)

TRELLIS CODING WITH SUBSTRATES

BACKGROUND OF THE INVENTION

The present invention relates to data transmission systems and, in particular, to channel coding in such systems.

Much attention has been focused in recent years on channel codes which provide so-called coding gain. Prominent among these are the so-called "trellis" codes described in such papers as G. Ungerboeck, "Channel Coding With Multilevel/Phase Signals," *IEEE Trans. Informaton Theory*, IT-28, 1982, pages 55–67; A. R. Calderbank and N. J. A. Sloane, "A New Family of Codes for Dial-Up Voice Lines," *Proc. IEEE Global Telecomm. Conf.*, November 1984, pages 20.2.1–20.2.4; A. R. Calderbank and N. J. A. Sloane, "Four-Dimensional Modulation With an Eight-State Trellis Code," *AT&T Technical Journal*, Vol. 64, No. 5, May–June 1985, pages 1005–1018; A. R. Calderbank and N. J. A. Sloane, "An Eight-Dimensional Trellis Code," *Proc. IEEE*, Vol. 74, No. 5, May 1986, pages 757–759; and L.-F. Wei, "Rotationally Invariant Convolutional Channel Coding With Expanded Signal Space-Part I: 180 Degrees and Part II: Nonlinear Codes," *IEEE J.Select.Areas Commun.*, Vol. SAC-2, September 1984, pages 659–686, all of which are hereby incorporated by reference.

In typical known trellis coding arrangements, n of the bits of each of a succession of (k+n)-bit input words are applied to a so-called trellis coder which, in turn, selects one of a plurality of $2^m{}_k$ subsets of the signalling constellation, wherein m>n. Each subset contains $2^k$ signalling points and the other k bits, referred to herein as the non-trellis-coded bits, are used to identify a particular one of the $2^k$ points in the selected subset as the signal point to be communicated to the receiver. So-called Viterbi decoding is then used in the receiver to recover the most likely sequence of transmitted signal points and, in turn, the (k+n)-bit input words.

Conventional block coding would require a constellation of $2^{(k+n)}$ signal points to transmit the (k+n)-bit input words. By contrast, as can be seen from the foregoing, trellis coding requires a larger constellation of $2^{(k+m)}$ signal points. However, in exchange for this redundancy, a trellis code, if properly designed, will provide an increase over block coding in the minimum distance between signal points communicated to the receiver. This increase, when normalized by the average transmitted signal power, is referred to as the "coding gain" which manifests itself in the form of enhanced immunity to such random channel impairments as additive noise.

For the most part, work in the trellis coding arena has concentrated on the transmission of trellis-coded data over channels whose principal impairment is additive noise. There is, however, a class of channels having a so-called partial response characteristic which operates on the transmitted signal in such a way that each received signal pulse is a function of not only the signal pulses generated during the present baud, or signalling, interval, but also at least one signal pulses generated during at least one previous signalling interval. For example, the so-called (1-D) partial response channel delivers a signal each of whose pulses is equal to the difference of two consecutive transmitted pulses. Such a received signal can be decoded at the receiver using conventional techniques, such as Viterbi decoding, but such decoding, disadvantageously, is relatively complex.

SUMMARY OF THE INVENTION

One possible approach to the above problem using conventional trellis coding techniques is to (a) determine the signal point to be presented to the receiver and then (b) construct a second signal point such that when the second signal point is input to the channel, the desired signal point appears at the channel output. Such a construction would be based on the knowledge at the transmitter of both (a) the (1-D), or other deterministic, characteristic of the channel and (b) the value of that pulse or pulses transmitted in previous signalling intervals that the channel will be using to modify the pulses transmitted in the present signalling interval. In a (1-D) channel, for example, that value is the value of the last pulse generated in the previous signalling interval. With such an approach, the signal point, as received, would then be indistinguishable from a signal point that passed through a non-partial-response channel and the conventional Viterbi decoding could be used to recover the encoded data.

A major impediment to the practical implementation of such an approach, however, is that the transmission of particular sequences of signal points could result in the necessity of transmitting a huge and, in theory, infinite number of different signal points of unboundedly large magnitude.

The present invention, by contrast, provides a mechanism which allows trellis-coded data which has been subjected to a deterministic transformation in the channel, such as the (1-D) operation of a partial response channel, to be accurately decoded in the receiver while requiring the transmission of only a limited number of different signal points.

As in conventional trellis coding, n of the bits of each (k+n)-bit input word are applied to a trellis coder which, in turn, selects one of the predetermined subsets of the constellation of signal points from which the signal point to be communicated to the receiver is to be taken. However, the present coding technique, instead of identifying and transmitting a particular point in the selected subset in response to a particular combination of values of the k non-trellis-coded bits, identifies and transmits a second signal point, as in the first-described approach hereinabove. Similar to the approach mentioned above, this second signal point, which I call a "seed", is selected as a function of both (a) the values of the k non-trellis-coded bits and (b) the value or values, which I refer to as the "channel state," of that pulse or pulses transmitted in previous signalling intervals that the channel will be using to modify the pulses transmitted in the present signalling interval, and in such a way as to ensure that the signal point presented to the receiver is in the selected subset. In this way, the above-mentioned increase in the minimum distance between signal points that led to the use of the trellis code in the first place is preserved.

However, unlike the above-described approach—which, again, has the problem that the transmitter may be called upon to transmit an infinite number of different seeds at least one of whose components can become unboundedly large—the invention does not start from the premise that when the k non-trellis-coded bits have a particular combination of values, the receiver is to be presented with a particular one member of the selected subset.

Rather, the coding technique embodied in the present invention springs from my recognition that—at least when (a) the points of the constellation are the points of some predetermined lattice and (b) the subsets of the constellation are cosets of that lattice—the seeds can be chosen in such a way that the number of distinct seeds, and hence the number of channel states, is finite.

A consequence of this approach is that the different seeds transmitted to convey the same combination of non-trellis-coded bit values (as determined by the channel state at the time) may result in different signal points from the selected subset being presented to the receiver. Advantageously, however, as long as it is ensured that, for a given target coset, all the seeds whose transmission results in the receipt of a particular one signal point at the receiver have assigned to them a particular one combination of k non-trellis-coded bit values, those k bit values can be recovered in the receiver.

DETAILED DESCRIPTION

Figure 1:
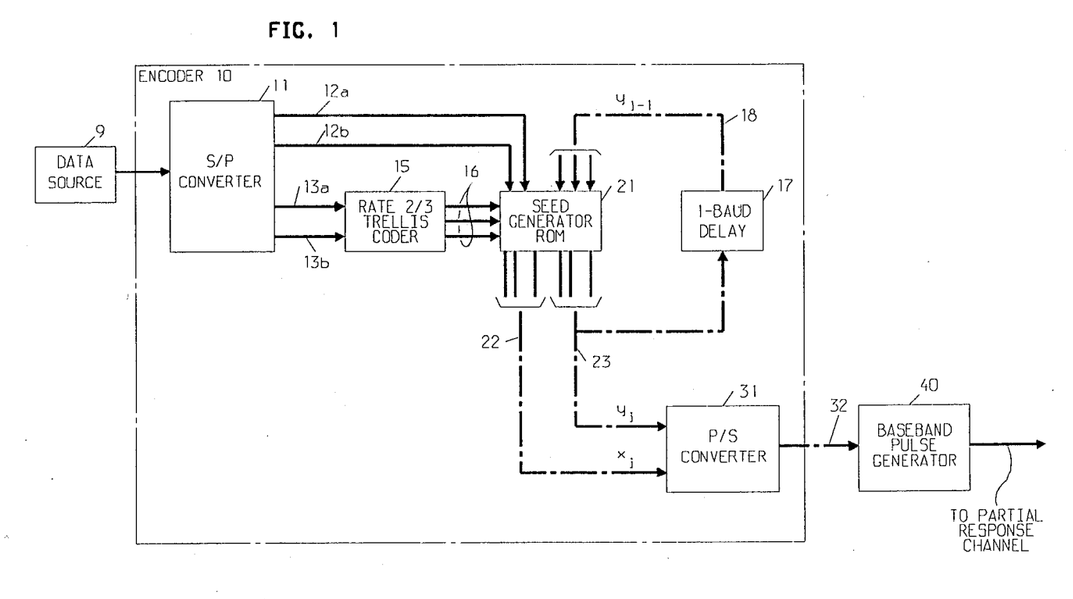
FIG. 1 is a block diagram of a data transmitter embodying the principles of the invention.

Encoder 10 in the transmitter of FIG. 1 receives data in the form of a serial bit stream from a data source 9. This bit stream is applied to serial-to-parallel (S/P) converter 11 within the encoder, which generates a sequence of (k+n)-bit words. Illustratively, both k=2; and n=2, and converter 11 generates these 4-bit words in parallel on its four output leads—two bits on leads 12a–b and the other two bits on leads 13a–b.

The task of the transmitter of FIG. 1 is to convey to a receiver (shown in FIG. 13) signals representing respective signal points of a constellation wherein the points of the constellation are points from a predetermined p-dimensional lattice. Illustratively, p=2. To this end, the bits on leads 13a–b, referred to herein as the "trellis-coded bits", are applied to a rate ⅔ trellis coder of conventional design. The output of coder 15 on leads 16 is a three-bit word identifying one of eight predetermined subsets of points of the aforementioned constellation. As discussed in further detail hereinbelow, the subsets, more particularly, are illustratively cosets of a predetermined sublattice of the lattice. The subset-, or coset-, identifying word, on leads 16 is applied to seed generator ROM 21, which also receives as inputs the two bits on leads 12a–b, referred to herein as the "non-trellis-coded bits". In accordance with the invention, seed generator ROM 21 receives as a further input a signal from leads 18 as will be described.

The job of seed generator ROM 21 is to generate a two-dimensional signal point $(x_i, y_i)$ whose two components $x_i$ and $y_i$ are provided on leads 22 and 23, respectively. (The subscript "i" advances at the signalling rate, i.e., the rate that S/P converter 11 puts out words on its output leads. Thus a two-dimensional signal point is output by seed generator ROM 21 for each converter 11 output word.) The components $x_i$ and $y_i$ are applied to parallel-to-serial (P/S) converter 31. The latter provides on its output leads 32 a multi-bit word representing $x_i$, followed by a multi-bit word representing $y_i$. These are applied to a conventional baseband pulse generator 40 which, for each word applied thereto, generates a baseband pulse whose amplitude is given by the input word value. The output of generator 40 is applied to the transmission channel.

In trellis coding arrangements known heretofore, it is generally assumed that the principal impairing effect of the transmission channel is to add a measure of noise to the transmitted signal. In the present arrangement, however, the channel is assumed to be a so-called partial response channel. Such channels, like virtually all real-world channels, still add a measure of noise to the transmitted signal. In addition, however, the partial response channel assumed for this embodiment operates on the transmitted signal in such a way that the value of each signal pulse received at the output of the channel is equal to the difference between the value of a particular transmitted pulse and the value of the pulse transmitted immediately before it. Such a channel is referred to as a (1-D) channel. In this embodiment, then, what is presented by the channel to the receiver is the point $(x_i', y_i')$ $=(x_i-y_{i-1}, y_i-x_i)$--actually a noise-corrupted version thereof—where it is assumed, as indicated above, that the components $x_i$ and $y_i$ are transmitted as sequential pulses.

Where the principal effect of a channel is to add noise, the most likely sequence of transmitted signal points can be ascertained at the receiver using, for example, straightforward Viterbi decoding to identify the correct sequence of cosets. However, where a conventionally trellis-coded signal is subjected not only to channel impairments such as additive noise, but also to the (1-D) operation imposed by the partial response channel, the most likely sequence of signal points cannot be deduced without substantially increasing the complexity of the Viterbi decoder.

The present invention, however, provides a mechanism which allows trellis-coded signals to be transmitted over a partial response channel and accurately decoded at the receiver using a decoding arrangement which is no more complex than that which is currently used to decode trellis coded signals transmitted over non-partial-response channels. The coding gain advantages afforded by trellis coding generally are thus extended in a practical way to the realm of the transmission of data over partial response channels.

In order to better explain the invention, it is helpful to review the basics of trellis coding as known in the prior art.

A useful way to begin is to choose a lattice L from which the points of the signalling constellation are chosen. In the present embodiment, we choose as the lattice L the lattice of all two-dimensional points whose components are integers. Mathematically such a lattice is said to be the lattice spanned by the vectors (1,0) and (0,1). From here, a so-called sublattice M is chosen. The sublattice M is a lattice comprised of a subset of points of the lattice L. In the present embodiment, the sublattice M consists of all points in the lattice L whose norm is divisible by 8, the norm of a point being the sum of the squares of the components. Mathematically, such a sublattice is said to be the lattice spanned by the vectors (2,2) and (2,$\bar{2}$). It includes such points as (0,0), (2,2), (2,$ovs/2/$), (4,0), etc., where $\bar{2}$ is the notational equivalent of $-2$.

Figure 2:
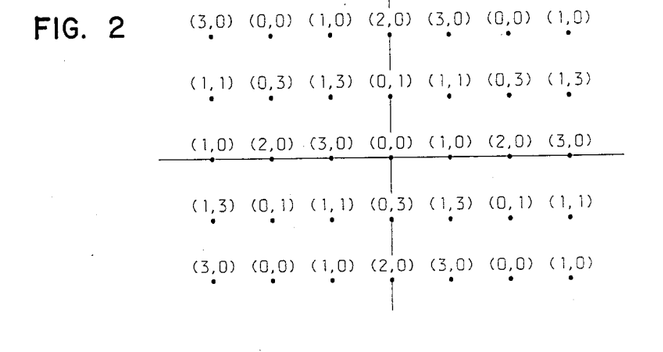
FIG. 2 shows a portion of the lattice from which the signalling constellation used in the transmitter is chosen.

Having defined the sublattice M, we inherently have defined a number of cosets of M in the lattice L. Specifically, the cosets of the sublattice are the unique sets of points in the lattice obtained by various translations of the sublattice. In this example, there are eight cosets of M in L which, for convenience, can each be labeled with a representative point from the coset. Specifically, the labels are the representative points (0,0), (2,0), (1,1), (1,3), (0,3), (0,1), (3,0) and (1,0). FIG. 2 shows a portion of lattice L with the various points denominated with the label of the coset to which they belong.

The underlying theory of trellis coding is that at any point in time, only the points in particular cosets, as defined by a so-called trellis diagram, are allowed to be transmitted. The trellis diagram of FIG. 3, for example, represents the operation of trellis coder 15 of FIG. 1.

Figure 3:
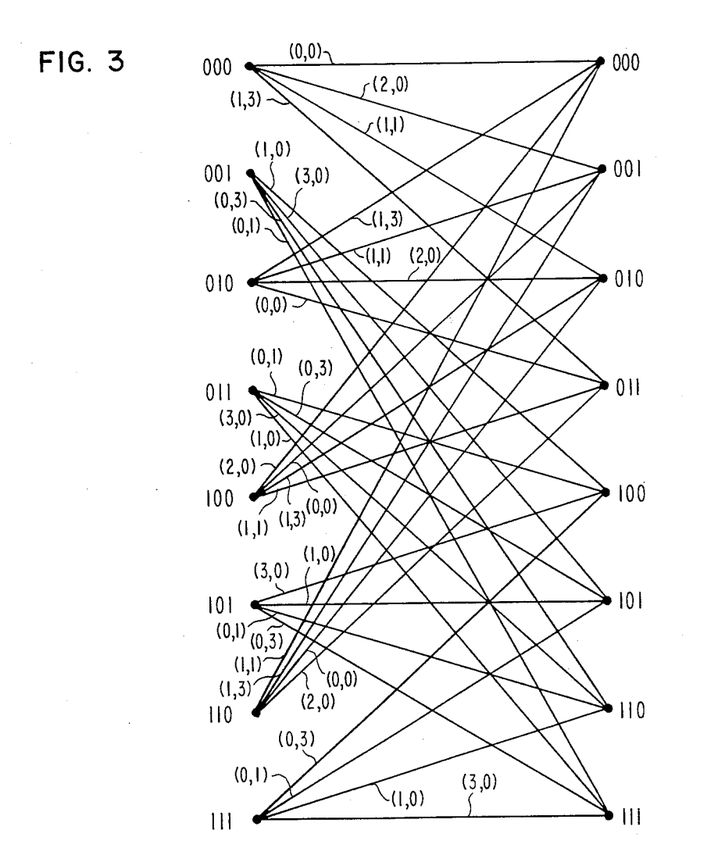
FIG. 3 is a trellis diagram depicting the trellis code used in the transmitter of FIG. 1.

In particular, trellis coder 15 has eight "states", denoted 000, 100, 010, 110, 001, 101, 011, and 111. The state of a trellis coder is a function of at least one bit of at least one input word received prior to the current input word. In this embodiment, more specifically, the state of the coder is a function of (a) the two bits applied to the coder previous to the two current bits and (b) one of the bits applied to the coder previous to that. Thus, for example, if the coder is in state 001, this means that the two bits previously applied to the coder were "1" and "0" (the bits of the state are read right-to-left) and that one of the bits of the pair applied to the coder before that—illustratively the bit on lead 13b—was "0". Further, if the current bit pair on leads 13a-b is, for example, 11, then the next state will be 111.

The two vertical lines of points in FIG. 3 represent the eight possible coder states at successive time intervals, and the lines, or edges, connecting various pairs of states indicate the possible state transitions. Thus, for example, it is possible for the coder to transition from state 010 to state 001 but not to state 100.

Each of these connecting lines bears a label indicating which coset the next signal point to be generated is to come from. Thus, continuing the example above, assume that the current state of the coder is 001 and that when the next set of bits is output from S/P converter 11, the bit pair on leads 13a-b is "11". This means that the next signal point to be generated is to come from coset (0,1) since the line connecting state 001 in the left column to state 111 in the right column is labeled (0,1).

Figure 4:
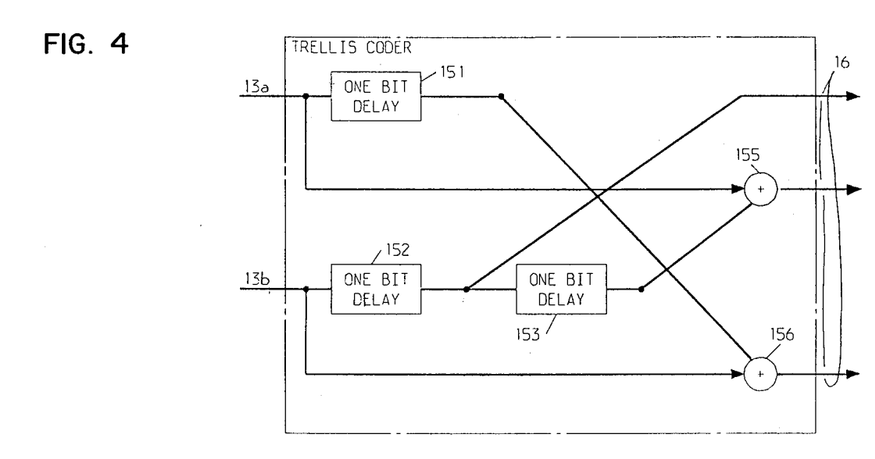
FIG. 4 is a block diagram of the trellis coder used in the transmitter of FIG. 1.

A circuit embodiment of trellis coder 15 is shown in FIG. 4. The two current bits applied to the coder are applied thereto from leads 13a-b. The two bits previously applied to the coder are held in one-bit delay elements 151 and 152. The bit applied to the coder on lead 13b before that is held in one-bit delay element 153, which gets its input from the output of delay element 152. The values held in the three delay elements are applied to binary adders 155 and 156, along with the values of the two current bits on leads 13a-b, in the manner shown. Each binary adder outputs a "0" ("1") if an even (odd) number of its input bits has the value "1".

The outputs of delay elements 152 along with the outputs of adders 155 and 156 constitute the output word of the coder, thereby identifying which of the eight cosets the next signal point to be generated belongs to. Specifically, the trellis coder outputs 000, 001, 010, 011, 100, 101, 110 and 111 identify the cosets (0,0), (2,0), (1,1), (1,3), (1,0) (3,0), (0,3) and (0,1), respectively.

Once the coset has been selected, a conventional trellis coding arrangement would then use the k(=2 in this example) non-trellis-coded bits on leads 12a-b to select a particular one of $2^k$ signal points in the selected coset as the point to be transmitted. In accordance with the present invention, however, those k bits are used in conjunction with a) the coset-identifying word on leads 16 and b) the value of the channel state, which for a (1-D) channel is given by $y_{i-1}$, i.e., the second component of the previous point applied to the channel, appearing on output leads 18 of 1-baud delay element 17, to identify what I refer to as a "seed". The seed is a p-dimensional point which, in general, is not in the selected coset. Indeed, the seed need not, in general, be in the lattice L (although it turns out that all the seeds are in lattice L in this embodiment). And it is the seed, rather than a point from the selected coset, that is applied to the channel via converter 31 and generator 40.

The seed is chosen with a number of criteria in mind. First of all, it is necessary that once the seed has passed through the partial response channel, the resultant signal point presented to the receiver must be a point in the coset identified by the trellis coder, hereinafter referred to as the "target" coset. By ensuring this, it can be ensured that Viterbi decoding of no greater complexity than is needed to recover the trellis-coded bits in a non-partial-response transmission system can be used to reconstruct the sequential states of trellis coder 15 in the transmitter and thereby recover the trellis-coded bits on leads 13a-b. This implies that, given the target coset, seed generator ROM 21 must be able to transmit a number of different seeds to represent each possible combination of the non-trellis-coded bits on leads 12a-b. This is because a seed, when transmitted, is subject to being altered by the (1-D) channel in a way that, depends on the number of different possible channel states, i.e., the different possible values of $y_{i-1}$. Thus, given a particular target coset and channel state, an ensemble of seeds, referred to herein as a "seed alphabet", has to be able to be generated in order to represent each different combination of values of the non-trellis-coded bits on leads 12a-b. In the present embodiment, for example, each seed alphabet needs to contain four seeds since there are four different possible combinations of values of the non-trellis-coded bits on leads 12a-b. And, to repeat, each of those seeds must be such that, when it is altered by the (1-D) operation of the partial response channel, the resultant signal point applied to the receiver is a point in the target coset identified by trellis coder 15. It will thus be appreciated that the seed that is output by ROM 21 is identified by (a) the target coset, (b) the channel state, and (c) the values of the non-trellis-coded bits.

There must be at least $2^{(k+m)}$ seeds overall. This can be seen from the fact that (a) no matter what the channel state, we need to be able to provide at the channel output at least $2^k$ different points in any of the $2^m$ cosets that may be specified by the trellis coder and (b) it can be easily shown that, given a particular channel state, different signal points at the channel output can only be arrived at by transmitting different seeds. In theory, then, the required number of seeds may be as many as $2^{(k+m)}$ times the number of channel states. It will often turn out, however, that a seed can be in more than one seed alphabet.

In addition, given a particular channel state, there must be, for each coset, at least $2^k$ seeds which, when transmitted from that channel state, result in a signal point from that coset.

A further point is this: Viterbi decoding of the cosets in the conventional way can certainly be used in the receiver to deduce the most likely sequence of the eight states of trellis coder 15 and, thus, to deduce the most likely sequence of bits on leads 13a–b. Such an approach will not, however, deduce the encoder channel states and thus will not be able to determine which seed alphabet the received signal point originated from. This is significant because, in general, at least some signal points can appear at the receiver as the result of the transmission of seeds from different ones of the seed alphabets associated with a particular target coset. Thus not knowing which seed alphabet the received signal point originated from means that, in general, it is not possible to recover the non-trellis-coded bits therefrom.

One alternative would be to employ more complex Viterbi decoding to, in fact, derive the most likely sequence of the $8 \times 4 = 32$ trellis coder state/channel state combinations and thus determine which seed alphabet the transmitted seed originated from. Armed with the identity of the seed alphabet, it would be possible to work backwards using (a) the non-trellis-coded-bit-to-seed assignment scheme for that seed alphabet and (b) the received point itself to recover the non-trellis-coded bits.

In accordance with a feature of the inventon, however, such complexity is not necessary. Instead we assign the non-trellis-coded bit values to particular seeds in such a way that, for a given target coset, all the seeds whose transmission results in the receipt of a particular one signal point have assigned to them a particular one combination of non-trellis-coded bit values. Thus receiving a particular signal point while in a particular trellis coder state implies that a particular identifiable set of non-trellis-coded bit values was transmitted. Combining that set of values with the trellis-coded bit values derived in the Viterbi decoder thus completely reconstructs the four input bits at the output of S/P encoder 11.

The foregoing may be more fully appreciated by considering a concrete example. To this end, attention is directed to FIGS. 5–12, each of which includes an encoder decision rule table showing, for a respective target coset, (a) the four seed alphabets associated with the four channel states and (b) the non-trellis-coded-bits-to-seed assignment scheme.

Figure 5:
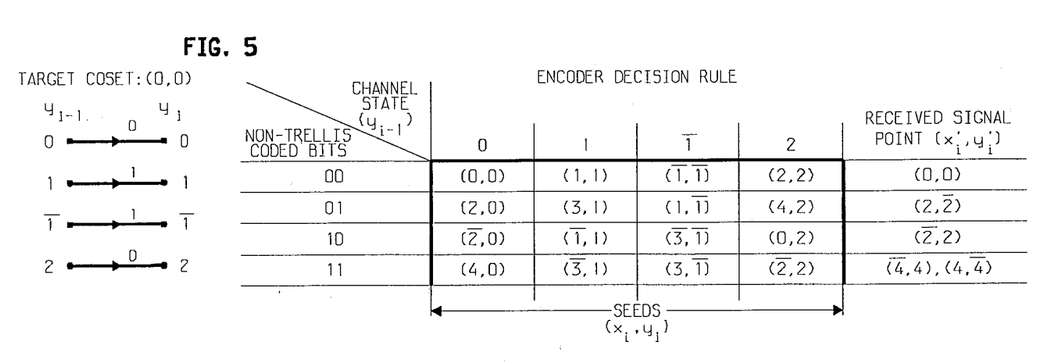
FIGS. 5–12 are charts helpful in understanding the illustrative embodiment.
Figure 6:
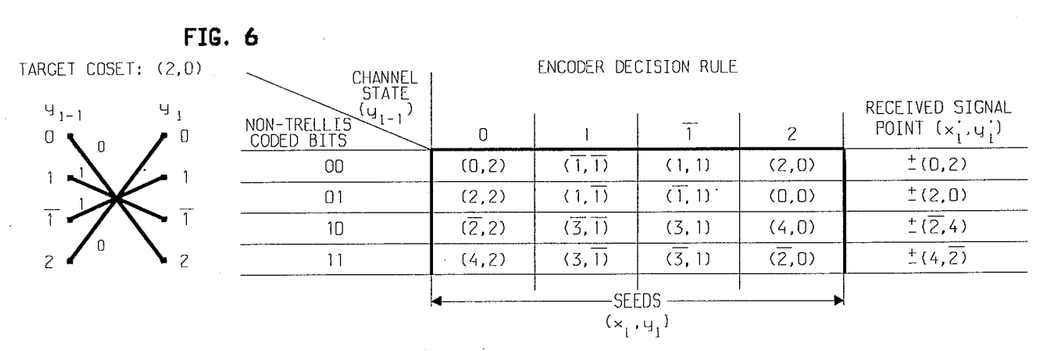
Figure 7:
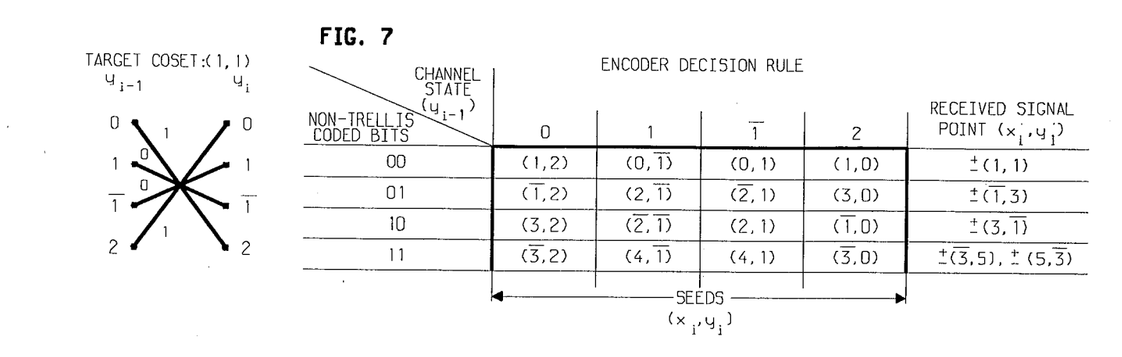
Figure 8:
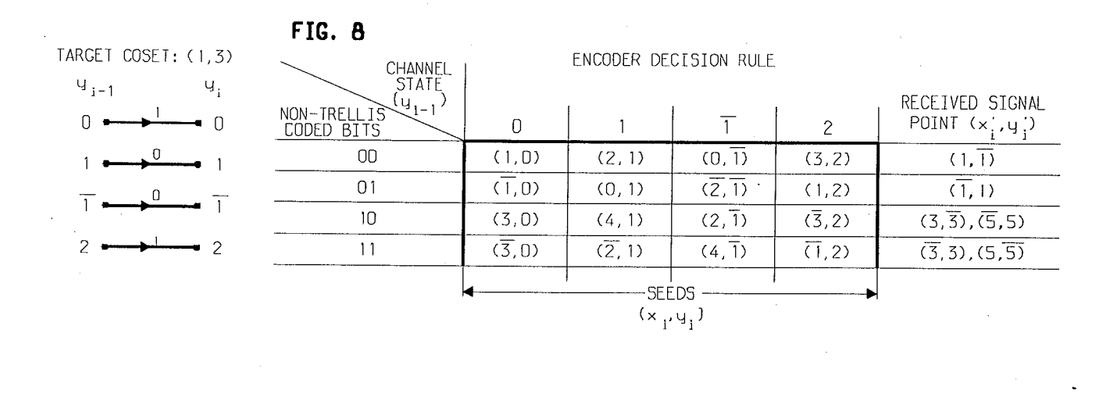
Figure 9:
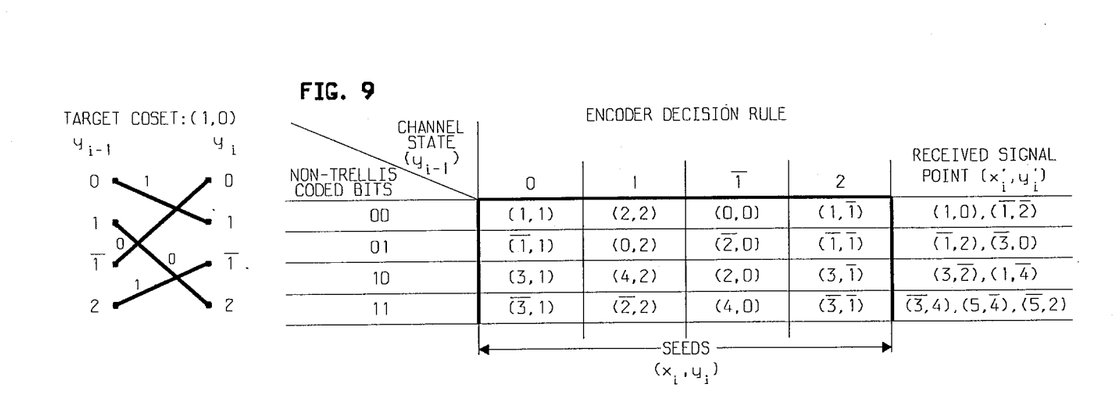

FIG. 5, for example, shows the seed alphabets and assignment scheme for the target coset (0,0). The four channel states are labeled 0, 1, $\bar{1}$, and 2, corresponding to the four possible values that $y_i$—which becomes $y_{i-1}$ in the subsequent signalling interval—can take on in this embodiment.

Listed in a column under each channel state are the seeds of the associated seed alphabet, such as the seeds (0,0), (2,0), (2,$\bar{0}$), and ($\bar{4}$,0) associated with channel state "0". In the right-most column are the signal points presented to the receiver after having passed through the (1-D) partial response channel. (The notation "($\bar{4}$,4) or (4,$\bar{4}$)" in the last line of the column is indicative of the fact that two of the seeds in that line result in the received signal point ($\bar{4}$,4), while the other two result in the received signal point (4,$\bar{4}$).)

Thus, for example, the table shows that transmission of the seed (3,1) from channel state "1"(i.e., $y_{i-1} = 1$) results in the received signal $(x_i', y_i') = (x_i - y_{i-1}, y_i - x_i) = (3\text{-}1, 1\text{-}3) = (2, \bar{2})$. Note that each of the signal points in the "received signal" column is, indeed, a member of the target coset (0,0), as can be verified from FIG. 2. Note, too, that all the seeds whose transmission results in the receipt of a particular one signal point have assigned to them a particular one combination of non-trellis-coded bit values. Thus, for example, all of the seeds whose transmission results in the receipt of the signal point (2,$\bar{2}$) have assigned to them the non-trellis-coded bit pair values 01.

FIGS. 6–12 include similar encoder decision rule tables, each for a different target coset. As a matter of notation, a ± in the "received signal point" column means that the received signal point following the ± is either the one actually listed or the signal point derived by changing the signs of both components. Thus in FIG. 6, for example, two of the seeds associated with the non-trellis-coded bit pair 10 result in the received signal point ($\bar{2}$,4) while the other two result in the received signal point (2,$\bar{4}$). And in the last line of the table in FIG. 7, each of the four seeds associated with the bit pair 11 results in a different one of the received signal points ($\bar{3}$,5), (3,$\bar{5}$), (5,$\bar{3}$) and ($\bar{5}$,3).

The encoder decision rule table in each of FIGS. 5–12 is graphically embodied in a channel state trellis diagram shown next to each table. In each channel state trellis diagram, the points in the left-hand column of points represent the four possible channel states, corresponding to the four possible values of $y_{i-1}$. The points in the right-hand column of points represent the four possible values of $y_i$ which, of course, will become $y_{i-1}$ in the next signalling interval. The lines, or "edges", connecting the various pairs of states indicate the possible state transitions. Specifically, it is the case in every channel state trellis diagram that, from a given channel state, there is only one channel state that can be transitioned to. That is, given a particular value of $y_{i-1}$, there is only one allowed value for $y_i$. This is a consequence of the fact that, given the value of $y_{i-1}$, there is only one possible value of $y_i$ that can result in a received signal point in the target coset. Moreover, for each channel state transition, only certain values of $x_i$ are allowed because, again, only those certain values result in the received signal point being in the target coset. Specifically, edges labeled with a "0" require that $x_i$ be an even number, while edges labeled with a "1" require that $x_i$ be an odd number.

Figure 12:
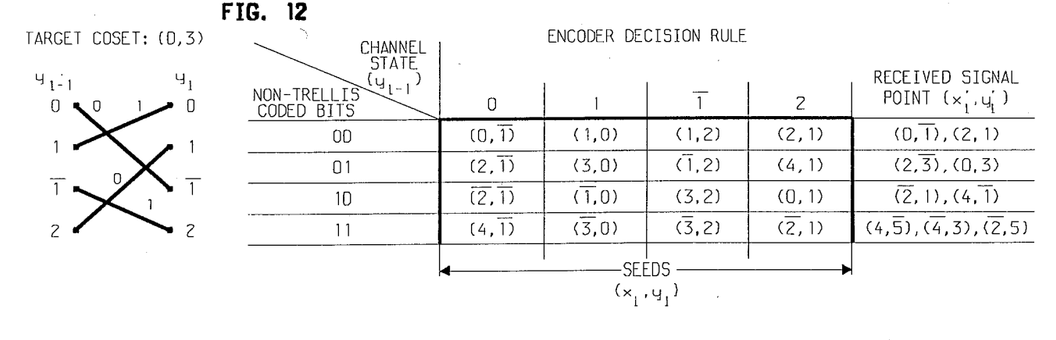

Thus looking at FIG. 12, for example, the channel state trellis diagram tells us that if the channel state is "0", then the seed to be generated must have $y_i = \bar{1}$. Moreover, the "0" which labels the edge connecting the "0" to 1 means that $x_i$ must be an even number. And, indeed, this is consistent with the entries in the $y_{i-1} = 0$ column of the FIG. 12 encoder decision rule table.

It is useful at this point to indicate how the channel state trellis diagrams, and seed alphabets, such as those shown in FIGS. 5–12 can be arrived at.

We begin by realizing that trellis coder 15 may specify any of the eight cosets as the target coset at any point in time. Thus no matter what channel state the encoder is in—that is, no matter which of the possible values of $y_{i-1}$ we are faced with—we have to be able to generate a seed that will result in a received signal point in any of the eight cosets.

Moreover, analyzing the cosets themselves, we can recognize that each coset can be characterized by the congruence, modulo 4, of the components of each member of the coset. (As a matter of mathematical definition, x is congruent to y, modulo 4, if $(x-y)/4$ is an integer. Thus, 0, 4, 8, etc. are congruent to 0 modulo 4; 1, 5, 9, etc. are congruent to 1 modulo 4; 2, 6, 10, etc. are congruent to 2 modulo 4; and 3, 7, 11, etc. are congruent to 3 modulo 4.) For example, all the members of the coset (3,0) have a congruence, modulo 4 of either (3,0) or (1,2), meaning that the first and second components of each member of the coset are either congruent to 3 and 0, respectively—such as the point $(\bar{1},0)$—or are congruent to 1 and 2, respectively—such as the point $(1,\bar{2})$.

Given this characterization of the cosets, we can proceed as follows:

Assume arbitrarily that an allowed value for $y_i$ is "0" which, of course, is congruent to 0 modulo 4. Assume further that, in fact, $y_{i-1}=0$ and the the target coset, as specified by trellis coder 15 is coset (3,0). We can thus begin to construct the channel state trellis diagram for this coset (FIG. 10) by establishing a point labeled "0" in the $y_{i-1}$ column. Since, as discussed above, the first component of each member of coset (3,0) is congruent to either 1 modulo 4 or 3 modulo 4, then $x_i$ must be an odd number. We thus know that we must have an edge emanating from channel state "0" which bears a label indicating $x_i$ is odd, that label illustratively being a "1".

Figure 10:
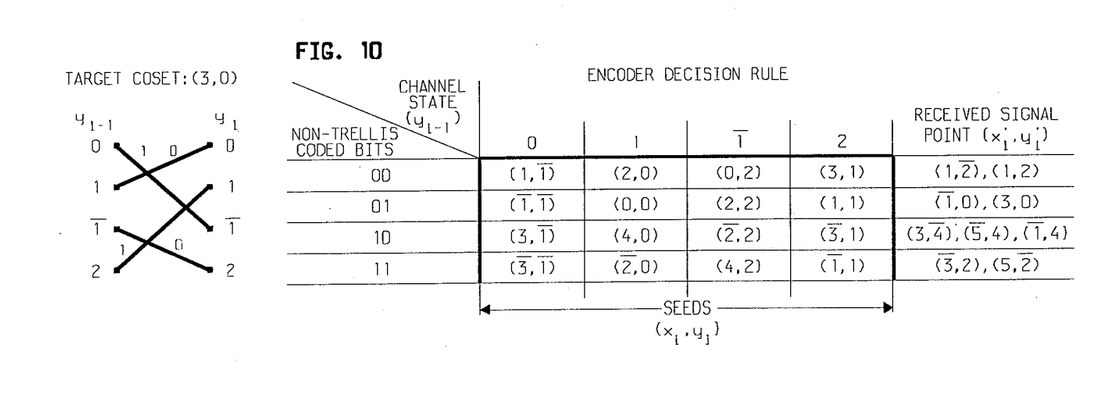
Figure 11:
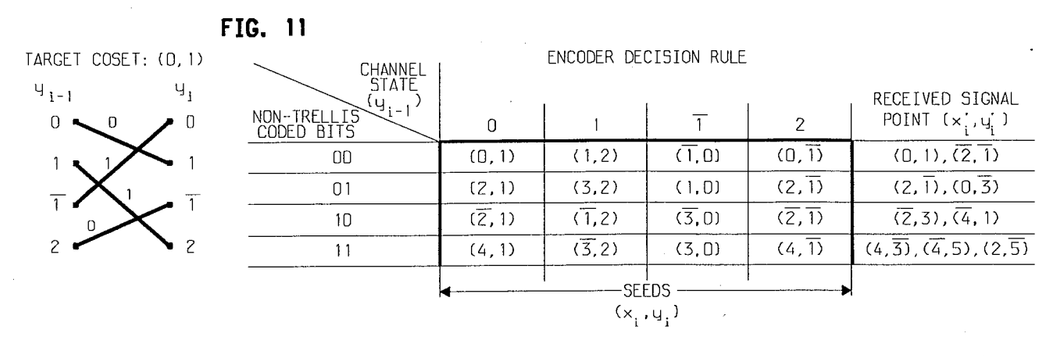

The foregoing then has the following implications for $y_i$: If, on the one hand, $x_i$ is an odd number of the type that is congruent to 1 modulo 4, then the congruence modulo 4 of $x_i'$, i.e., the first component of the received signal point $(x_i', y_i')$, must be "1", remembering that that received point must be in the target coset (3,0). We are therefore generating a seed which will result in a point from coset (3,0) having congruence type (1,2). That is, we now know that $y_i'$ must be congruent to 2 modulo 4. But, $y_i'=(y_i-x_i)$. As a result, $y_i$ must be congruent to 3 modulo 4 and therefore the edge emanating from the channel state labeled "0" must terminate in a channel state labeled with a number congruent to 3 modulo 4.

If, on the other hand, $x_i$ is an odd number of the type that is congruent to 3 modulo 4, then the congruence modulo 4 of $x_i'$ must be "3", again remembering that that received point must be in the target coset (3,0). We are therefore generating a seed which will result in a point from coset (3,0) having congruence type (3,0). That is, we now know that $y_i'$ must be congruent to 0 modulo 4. But, $y_i'=(y_i-x_i)$. The result, as before, is that $y_i$ must be congruent to 3 modulo 4. Thus, no matter what odd value $x_i$ takes on, $y_i$ must be congruent to 3 modulo 4.

In one sense, any such point will do because as long as $y_i$ is congruent to 3 modulo 4 and $x_i$ is odd, the received signal point is guaranteed to be in the target coset (3,0), which is all that we care about from the standpoint of constructing the channel state trellis diagram. However, considerations of minimizing the signal power introduced into the channel makes it advantageous to choose a value having the lowest possible magnitude, which in this case is $\bar{1}$. Instead, the overall collection of seeds will typically be chosen so as to minimize the average transmitted power of the collection.

The endpoints of one edge of FIG. 10 channel state trellis diagram have thus been determined.

Of course, the present $y_i$ is the future $y_{i-1}$. That is, the fact that $y_i$ has the value $\bar{1}$ means that, at some future time, the encoder will reside in the channel state $\bar{1}$. And, inevitably, trellis coder 15 will again specify (3,0) as the target coset. It is thus necessary to have a point labeled "$\bar{1}$" in the $y_{i-1}$ column of the FIG. 10 channel state trellis diagram.

Finding ourselves in this channel state, we recognize that, now, $x_i$ has to be an even number. Otherwise, again, we wouldn't be able to arrive at an $x_i$ congruent to either 1 modulo 4 or 3 modulo 4, as is required for this coset. Following a line of logic similar to that presented above for the edge connecting channel states "0" and "$\bar{1}$", we would discover that $y_i$ must be congruent to 2 modulo 4. Choosing the digit "2" to be the value of $y_i$ congruent to 2 modulo 4 and then continuing with the same line of logic as above, we will discover that from channel state "2", generating a point in coset (3,0) results in a value of $y_i$ congruent to 1 modulo 4—illustratively chosen to be "1" and $x_i$ odd. And from channel state "1", generating a point in coset (3,0) results in a value of $y_i$ congruent to 0 modulo 4 with $x_i$ even.

Thus it is seen that the loop is closed, at least with respect to coset (3,0). Moreover, it can shown that a point in any of the other seven cosets can be arrived at from seeds having the same four values of $y_i$. Thus we have seen that with a minimum of four states, each representing a $y_i$ having a different congruence modulo 4, we can specify any desired number of seeds which will cause a point in the target coset to appear at the receiver, simply by allowing $x_i$ to take on as many odd or even values as we like.

If it is desired to communicate more than four bits per signalling interval, this is easily accommodated in the present embodiment by simply expanding the number of seeds in each seed alphabet. One way this could be accomplished would be to simply expand the universe of $x_i$'s beyond the values already being used. This may not, however, result in an efficient use of signal power because the maximum value of $x_i$ will be greater than it would be if we were to increase the number of seeds by expanding the universe of both the $x_i$'s and the $y_i$'s.

In order to expand the number of $y_i$'s, we simply define more channel states and expand the channel state trellis diagram accordingly. In particular, we recognize that each existing edge of the diagram can be regarded as a family of edges each of whose initial states have a particular congruence and each of whose final states have a particular congruence, with each edge of the family bearing the same label.

Thus, for example, the present embodiment could be expanded to have eight channel states—the original four states 0, 1, $\bar{1}$, and 2, and four new states 4, 3, $\bar{3}$, and 2. The edge, for example, connecting channel states "0" and "$\bar{1}$" in FIG. 10 can thus be expanded to four edges, namely edges connecting channel states "0" and "$\bar{1}$", "0" and "3", "4" and "$\bar{1}$", "4" and "3". All such edges will bear the label "1" for $x_i$, indicating that all seeds defined by these edges—like the original one edge—have $x_i$ odd.

At this point, all that remains to be considered is the operation of the receiver.

Figure 13:
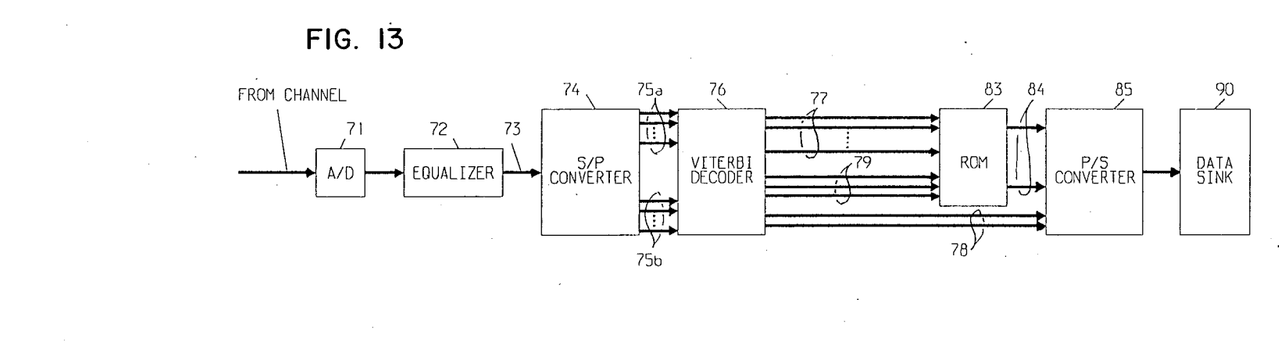
FIG. 13 is a block diagram of a receiver adapted to recover the data encoded and transmitted by the transmitter of FIG. 1 after having passed through a (1-D) partial response channel.

The receiver of FIG. 13, in particular, is of conventional design. In particular, the stream of baseband pulses on the channel is applied to A/D converter 71 and thence through a conventional equalizer 72 which compensates for distortion in the channel and provides a signal on its output lead 73 representing the stream of received pulses.

The pulses on lead 73 are converted into two multi-bit words by S/P coverter 74. Specifically, S/P converter 74 provides on each of its two sets of multi-bit output leads 75a and 75b a multi-bit signal representing $x_i'$ and $y_i'$, respectively i.e., the value of the first and second components of the current received signal point. In general, these component values are not whole integers, due to a possible myriad of channel effects and impairments that equalizer 72 was not able to compensate for. Thus, a typical received signal point might be, for example (2.1, −1.9).

It is the task of Viterbi decoder 76, which receives the signal point on leads 75a-b, to determine the most likely sequence of signal points. The Viterbi decoder is of conventional design and need not be discussed in detail. (For details on the operation of Viterbi decoders, see, for example, A.J. Viterbi and J.K. Omura, *Principles of Digital Communication and Coding* (New York: McGraw-Hill) 1979, hereby incorporated by reference.) Rather, it suffices to note that decoder 76 applies the so-called Viterbi algorithm to the trellis of FIG. 3 to determine the most likely sequence of transmitted signal points and, in the process, to determine the state of trellis coder 15 as the corresponding seed was generated. Viterbi decoder 76 provides (a) the estimated sequence of signal points on multi-bit output leads 77, (b) a three-bit word identifying the coset from which the point on leads 77 comes, this on leads 79, and (c) the values of the two bits that appeared on leads 13a-b in the transmitter at the time that the corresponding seed was generated, this on leads 78.

The two bits that appeared on leads 12a-b at that time are recovered from the signals on leads 77 and 79. In particular, those signals are applied to ROM 83. The latter includes eight internal lookup tables, one corresponding to each coset. Each table includes, in essence, the first and last columns of the encoder decision rule table (FIGS. 5-12) for the corresponding coset. In response to the coset-identifying signal on leads 79, ROM 83 is steered to the table for the coset in question. In this table it finds an entry for the signal point on lead 77 and locks up the corresponding k 32 2 non-trellis-coded bits (first column encoder decision rule table) and provides them on leads 84. It is instructive to again note that such straightforward recovery of the non-trellis-coded bits would not be possible but for the fact that we have ensured that all the seeds whose transmission results in the receipt of a particular one signal point have assigned to them a particular one combination of non-trellis-coded bit values. The four bits on leads 78 and 84 are applied in parallel to P/S converter 85, where they are provided in serial form to data sink 90.

The foregoing merely illustrates the principles of the present invention. For example, consider the following: Within any signalling interval, the running sum of that which is delivered by the channel is simply given by $(y_i - y_{i-1})$, because the received signal point $(x_i', y_i')$ has a $+x_i$ term and $a - x_i$ term. Moreover, since each $y_i$ is matched by $a - y_i$ in the next signalling interval, the running sum is guaranteed to be bounded. As is well known, this implies that the line signal at the channel output has a spectral null at dc. This being so, I have realized that in applications where it is desired to transmit a trellis-coded signal with such a spectral null (a number of such applications being discussed, for example, in my co-pending U.S. patent application with T. Lee, Ser. No. 914,337 filed Oct. 2, 1986), this may be achieved by using an encoder embodying the principles of the invention, such as the encoder of FIG. 1, subjecting the resulting stream of seeds to a (1-D) operation in the transmitter, and transmitting the resulting signal points through the (non-partial-response) channel. In such an application, the concern would not be to minimize the average seed power, since the seeds are processed only within the encoder, but rather to minimize the average power of the signal points resulting from the (1-D) operation since that is what is put out on the channel. To this end, the ensemble of seeds would be chosen in such a way as to minimize the average power of the resulting signal points.

Moreover, although a particular constellation and particular trellis code are used in the illustrative embodiment, it will be appreciated that the present invention can be implemented in a system using any of a myriad of trellis codes and constellation including, for example, constellation comprised of higher-dimensional points, such as four- or eight-dimensional points. Also, the invention is not limited to dealing with (1-D) channels. Other channel characteristics can be dealt with by appropriate modeling of the channel state and generation of appropriate channel state trellis diagrams. In addition, although the system disclosed herein is embodied in the form of various discrete electronic building blocks and components, the invention could equally as well be embodied in a system in which the functions of any one or more of those building blocks and components or, indeed, all of the function thereof, are realized by, for example, one or more appropriately programmed processors.

It will thus be appreciated that those skilled in the art will be able to devise numerous arrangements which, although not explicitly shown or described herein, embody the principles of the invention and are thus within its spirit and scope.

What is claimed is:

1. A data transmitter for generating and sequentially applying to a transmission channel during each of a succession of signalling intervals at least a pair of signal pulses representing a respective one of a succession of (k+n)-bit input words, said channel being such that at least one of the signal pulses applied thereto during each one of said signalling intervals is modified as a function of the value of at least one signal pulse applied to the channel in a prior signalling interval, said transmitter comprising, means responsive to the values of n bits of said each input word and the value of at least one bit of a previous input word in said sequence for identifying one of $2^m$ predetermined cosets in a predetermined lattice, m being an integer greater than n, means responsive to the value of said at least one previous signal pulse for identifying a predetermined alphabet of seed signal points, each of said seed signal points being such that, when it is transmitted through said channel in said one signalling interval, the resulting signal point at the output of said channel is a point in the identified one coset, means for selecting an individual one of the seed signal points of the identified alphabet as a function of the values of the other k bits of said each input word, and means for applying to said channel as said at least pair of said pulses a plurality of signal pulses representing said selected seed signal point.

2. A data transmitter for generating and sequentially applying to a transmission channel during each of a succession of signalling intervals at least a pair of signal pulses representing a respective one of a succession of (k+n)-bit input words, said channel having a curent channel state defined by the value of at least one signal pulse applied to said channel in a prior signalling interval and said channel being such that at least one of the signal pulses applied thereto during each one of said signalling intervals is modified as a function of said current channel state, said transmitter comprising, coding means responsive to the values of n bits of said each input word and the value of at least one bit of a previous input word in said sequence for identifying one of $2^m$ predetermined subsets of a predetermined constellation of signal points, m being an integer greater than n, means responsive to the particular current channel state for identifying one of a predetermined plurality of seed signal point alphabets, each of said alphabets being associated with the identified one subset, each of the seed signal points of a particular alphabet being associated with a respective different set of values of the other k bits of said each input word, and each of the seed signal points of the identified alphabet being such that, when it is transmitted through said channel when said channel is in said particular current channel state, the resulting signal point at the output of said channel is a point in the identified one subset, and means for applying to said channel as said at least pair of said pulses a plurality of signal pulses representing the one of said seed signal points of the identified alphabet associated with the current values of the other k bits of said each input word.

3. The invention of claim 2 wherein the transmission through said channel of particular seed signal points from respective ones of said alphabets when said channel is in said particular current channel state results in a particular one signal point at the output of said channel and wherein all of said particular seed signal points are associated with the same particular set of values of said other k bits.

4. The inventon of claim 3 wherein the signal points of said constellation are points in a predetermined lattice and wherein each of said subsets is a coset of said lattice.

5. The invention of claim 2 wherein said coding means includes a trellis coder.

6. A transmitter for generating a sequence of outgoing signals for transmission over a communications channel in response to a sequence of (k+n)-bit input words, said channel having a channel state which, at any point in time, is a function of the values of a particular one or more of the signals previously applied to said channel, said channel changing the value of each signal transmitted thereover as a function of the then current channel state, said transmitter comprising means for identifying, for each input word, one of a predetermined plurality of subsets of a predetermined signalling constellation, said one of said subsets being identified as a function of a trellis coded signal generated in response to (a) n of the bits of said each input word and (b) at least one bit of a previous word of said input word sequence, each of said subsets having associated therewith a predetermined plurality of seed signal point alphabets, each of the alphabets associated with a particular subset being associated with a respective channel state and each seed signal point of each particular alphabet being such that a point in the subset with which each said particular alphabet is associated is provided at the output of said channel whenever said each seed signal point is applied to said channel when it is in the channel state with which said particular alphabet is associated, each different seed signal point of each alphabet being associated with a respective different set of the possible values of the k other bits of said each word, means for identifying the seed signal point (a) that is associated with the current values of said other k bits, and (b) that is in the alphabet associated with both the current channel state and with the identified subset, and means for generating signals representing each identified seed signal point as said sequence of outgoing signals.

7. The invention of claim 6 wherein transmission of particular seed signal points from different ones of the alphabets associated with said particular subset result in a particular one signal point at the output of said channel and wherein said particular seed signal points are all associated with the same set of possible values of said k other bits.

8. A method for generating and sequentially applying to a transmission channel during each of a succession of signalling intervals at least a pair of signal pulses representing a respective one of a succession of (k+n)-bit input words, said channel being such that at least one of the signal pulses applied thereto during each one of said signalling intervals is modified as a function of the value of at least one signal pulse applied to the channel in a prior signalling interval, said method comprising the steps of, identifying one of $2^m$ predetermined cosets in a predetermined lattice in response to the values of n bits of said each input word and the value of at least one bit of a previous input word in said sequence, m being an integer greater than n, identifying a predetermined alphabet of seed signal points in response to the value of said at least one previous signal pulse, each of said seed signal points being such that, when it is transmitted through said channel in said one signalling interval, the resulting signal point at the output of said channel is a point in the identified one coset, selecting an individual one of the seed signal points of the identified alphabet as a function of the values of the other k bits of said each input word, and applying to said channel as said at least pair of said pulses a plurality of signal pulses representing said selected seed signal point.

9. A method for generating and sequentially applying to a transmission channel during each of a succession of signalling intervals at least a pair of signal pulses representing a respective one of a succession of (k+n)-bit input words, said channel having a current channel state defined by the value of at least one signal pulse applied to said channel in a prior signalling interval and said channel being such that at least one of the signal pulses applied thereto during each one of said signalling intervals is modified as a function of said current channel state, said method comprising the steps of, trellis coding the values of n bits of said each input word and the value of at least one bit of a previous input word in said sequence to identify one of $2^m$ predetermined subsets of a predetermined constellation of signal points, m being an integer greater than n, identifying one of a predetermined plurality of seed signal point alphabets in response to the particular current channel state, each of said alphabets being associated with the identified one subset, each of the seed signal points of a particular alphabet being associated with a respective different set of values of the other k bits of said each input word, and each of the seed signal points of the identified alphabet being such that, when it is transmitted through said channel when said channel is in said particular current channel state, the resulting signal point at the output of said channel is a point in the identified one subset, and applying to said channel as said at least pair of said pulses a plurality of signal pulses representing the one of said seed signal points of the identified alphabet associated with the values of the other k bits of said each input word.

10. The invention of claim 9 wherein the transmission through said channel of particular seed signal points from respective ones of said alphabets when said channel is in said particular current channel state results in a particular one signal point at the output of said channel and wherein all of said particular seed signal points are associated with the same particular set of values of said other k bits.

11. The invention of claim 9 wherein the signal points of said constellation are points in a predetermined lattice and wherein each of said subsets is a coset of said lattice.

12. A method for generating a sequence of outgoing signal points for transmission over a communications channel in response to a sequence of (k+n)-bit input words, said channel having a channel state which, at any point in time, is a function of at least a portion of a particular one or more of the signal points previously applied to said channel, said channel changing each signal point transmitted thereover as a function of the then current channel state, said method comprising the steps of identifying, for each input word, one of a predetermined plurality of subsets of a predetermined signalling constellation, said one of said subsets being identified as a function of a trellis coded signal generated in response to (a) n of the bits of said each input word and (b) at least one bit of a previous word of said input word sequence, each of said subsets having associated therewith a predetermined plurality of seed signal point alphabets, each of the alphabets associated with a particular subset being associated with a respective channel state and each seed signal point of each particular alphabet being such that a point in the subset with which said each particular alphabet is associated provided at the output of said channel whenever said each seed signal point is applied to said channel when it is in the channel state with which said particular alphabet is associated, each different seed signal point of each alphabet being associated with a respective different set of the possible values of the k other bits of said each word, and generating as an individual one of said sequence of outgoing signal points the seed signal point (a) that is associated with the current values of said other k bits, and (b) that is in the alphabet associated with both the current channel state and with the identified subset.

13. The invention of claim 12 wherein transmission of particular seed signal points from different ones of the alphabets associated with said particular subset result in a particular one signal point at the output of said channel and wherein said particular seed signal points are all associated with the same set of possible values of said k other bits.

14. A method comprising the steps of generating a stream of seeds each having at least a first component in response to a respective one of a sequence of (k+n)-bit input words, and generating a signal point associated with each of said seeds, each signal point being a function of the associated seed and a state determined by the value of at least one component of at least one prior seed in said stream, said generating step including the steps of identifying, for each input word, one of a predetermined plurality of subsets of a predetermined signalling constellation, said one of said subsets being identified as a function of (a) n of the bits of said each input word and (b) at least one bit of a previous word of said input word sequence, each of said subsets having associated therewith a predetermined plurality of seed alphabets, each of the alphabets associated with a particular subset being associated with each different said state, and each seed of each particular alphabet being such that the associated signal point is a point in the subset with which said each particular alphabet is associated, each different seed of alphabet being associated with a respective different set of the possible values of the k other bits of said each word, and generating as an individual seed of said stream the seed (a) that is associated with the current values of said other k bits, and (b) that is in the alphabet associated with both the current state and the identified subset.

* * * * *

UNITED STATES PATENT AND TRADEMARK OFFICE
CERTIFICATE OF CORRECTION

PATENT NO. : 4,788,694

DATED : November 29, 1988

INVENTOR(S) : Arthur R. Calderbank

It is certified that error appears in the above-identified patent and that said Letters Patent is hereby corrected as shown below:

In the Title, "SUBSTRATES" should read --SUBSTATES--.

In the Abstract, line 5, "M>n" should read --m>n--; line 11, "cost" should read --coset--.

In the Detailed Description, Column 1, line 32, "$2^m_k$" should read --$2^m$--. Column 5, line 5, "(2,ovs/2/ )" should read --$(2,\bar{2})$--. Column 10, line 20, "can shown" should read --can be shown--; line 49, "4,3,$\bar{3}$" should read --4,$\bar{3}$,3--. Column 11, line 39, "k 32 2" should read --k=2--. Column 12, line 14, "constellation" should read --constellations--; line 15, "constellation" should read --constellations--. Column 16, line 45, "alphabet" should read --each alphabet--.

Signed and Sealed this

Ninth Day of April, 1991

Attest:

HARRY F. MANBECK, JR.

Attesting Officer     Commissioner of Patents and Trademarks